US012633500B2

(12) United States Patent
Noh et al.

(10) Patent No.: US 12,633,500 B2
(45) Date of Patent: May 19, 2026

(54) METHOD OF TREATING SUBSTRATE AND APPARATUS FOR TREATING SUBSTRATE

(71) Applicant: SEMES CO., LTD., Cheonan-si (KR)

(72) Inventors: Myoungsub Noh, Hwaseong-si (KR); Seong Gil Lee, Hwaseong-si (KR); Dong-Hun Kim, Gunpo-si (KR); Dong Sub Oh, Busan (KR); Jountaek Koo, Seoul (KR); Wan Jae Park, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 511 days.

(21) Appl. No.: 18/079,142

(22) Filed: Dec. 12, 2022

(65) Prior Publication Data

US 2023/0215699 A1     Jul. 6, 2023

(30) Foreign Application Priority Data

Dec. 31, 2021     (KR) ........................ 10-2021-0194304

(51) Int. Cl.
*H01J 37/32*               (2006.01)

(52) U.S. Cl.
CPC .. *H01J 37/32449* (2013.01); *H01J 37/32091* (2013.01); *H01J 37/32357* (2013.01); *H01J 37/3244* (2013.01); *H01J 37/32834* (2013.01)

(58) Field of Classification Search
CPC ........... H01J 37/32082; H01J 37/32091; H01J 37/32357; H01J 37/32412; H01J 37/32422; H01J 37/32449; H01J 37/32834; H01J 37/3244; C23C 16/45536–45542; C23C 16/50–517
See application file for complete search history.

(56) References Cited

U.S. PATENT DOCUMENTS

| | | | | | |
|---|---|---|---|---|---|
| 6,886,491 | B2 * | 5/2005 | Kim | ................. | C23C 16/45514 |
| | | | | | 118/723 E |
| 7,767,561 | B2 * | 8/2010 | Hanawa | ................. | C23C 14/48 |
| | | | | | 257/E21.057 |
| 10,304,660 | B1 * | 5/2019 | Shoeb | ............... | H01J 37/32146 |
| 10,410,877 | B2 | 9/2019 | Takashima et al. | | |
| 2002/0000202 | A1 * | 1/2002 | Yuda | ..................... | C23C 16/402 |
| | | | | | 156/345.35 |
| 2003/0034244 | A1 * | 2/2003 | Yasar | ................ | H01L 21/76843 |
| | | | | | 257/E21.585 |
| 2004/0004708 | A1 * | 1/2004 | Willis | ............... | H01J 37/32935 |
| | | | | | 356/72 |
| 2005/0217576 | A1 * | 10/2005 | Ishibashi | ........... | C23C 16/45574 |
| | | | | | 118/715 |
| 2008/0178805 | A1 * | 7/2008 | Paterson | ............... | H01J 37/321 |
| | | | | | 118/723 R |
| 2009/0084501 | A1 * | 4/2009 | Chen | ................. | H01J 37/32357 |
| | | | | | 156/345.1 |

(Continued)

FOREIGN PATENT DOCUMENTS

| | | |
|---|---|---|
| JP | 2015-531547 | 11/2015 |
| JP | 2016-154209 | 8/2016 |

(Continued)

*Primary Examiner* — Kurt Sweely

(57)               ABSTRACT

The apparatus includes a plasma chamber and a process chamber separated by an ion blocker. A plasma power source excites a first treatment gas into radicals, which mix with a second treatment gas in the process chamber to treat a substrate. A controller manages gas flow and power for cyclic treatments.

11 Claims, 10 Drawing Sheets

(56)          References Cited

U.S. PATENT DOCUMENTS

| | | |
|---|---|---|
| 2014/0080308 A1 | 3/2014 | Chen et al. |
| 2015/0187593 A1 | 7/2015 | Narushima et al. |
| 2015/0221479 A1* | 8/2015 | Chen ................. C23C 16/45565 |
| | | 118/723 MP |
| 2015/0371996 A1 | 12/2015 | Shin et al. |
| 2016/0236244 A1 | 8/2016 | Takahashi et al. |
| 2017/0194426 A1 | 7/2017 | Min et al. |
| 2020/0075313 A1* | 3/2020 | Wang ................... H01J 37/321 |
| 2021/0118687 A1 | 4/2021 | Wang et al. |
| 2021/0287877 A1 | 9/2021 | Kim et al. |
| 2021/0358762 A1 | 11/2021 | Oomori et al. |

FOREIGN PATENT DOCUMENTS

| | | |
|---|---|---|
| JP | 2021-068892 | 4/2021 |
| KR | 10-2015-0056641 | 5/2015 |
| KR | 10-2015-0076099 | 7/2015 |
| KR | 10-2015-0145823 | 12/2015 |
| KR | 10-2016-0100847 | 8/2016 |
| KR | 10-2017-0082300 | 7/2017 |
| KR | 10-2121640 | 6/2020 |
| KR | 10-2021-0047808 | 4/2021 |
| KR | 10-2021-0077757 | 6/2021 |
| KR | 10-2021-0115861 | 9/2021 |

* cited by examiner

METHOD OF TREATING SUBSTRATE AND APPARATUS FOR TREATING SUBSTRATE

CROSS-REFERENCE TO RELATED PATENT APPLICATION

This application claims the benefit of Korean Patent Application No. 10-2021-0194304, filed on Dec. 31, 2021, in the Korean Intellectual Property Office, the disclosure of which is incorporated by reference herein in its entirety.

BACKGROUND OF THE INVENTION

1. Field of the Invention

The present invention relates to a method of treating a substrate and an apparatus for treating a substrate.

2. Description of the Related Art

In order to manufacture an electronic device such as a semiconductor element or a display element, it is important to ensure an etching process to have high etch selectivity between an oxide film and a nitride film on a substrate. For example, as semiconductor elements such as DRAMs become highly integrated and increase in capacity, in order to perform an air gap process, there is a demand for a method of treating a substrate and an apparatus for treating a substrate, which are capable of implementing a high etching selectivity between a silicon oxide film and a silicon nitride film.

As a related art, there is Korean Unexamined Patent Publication No. KR20150145823A.

SUMMARY OF THE INVENTION

To solve the problems described above, an object of the present invention is to provide a method of treating a substrate and an apparatus for treating a substrate, capable of implementing a high etching selectivity between a silicon oxide film and a silicon nitride film. However, since the above object has been set forth for illustrative purposes, the scope of the present invention is not limited by the object.

According to one aspect of the present invention, a method of treating a substrate within a chamber includes performing a unit cycle at least one time, in which the unit cycle includes a substrate treatment step of supplying a reaction gas in which radicals constituting plasma of a first treatment gas are mixed with a second treatment gas onto the substrate, wherein the substrate includes a first thin film, and a second thin film having a lower reactivity to the reaction gas than the first thin film.

According to the method of treating the substrate, the unit cycle may further include: a chamber stabilization step of supplying the second treatment gas onto the substrate before the substrate treatment step; and a by-product removal step of removing a treatment by-product generated in the substrate treatment step after the substrate treatment step.

According to the method of treating the substrate, the substrate treatment step may include: generating a solid by-product by reacting the reaction gas with the first thin film; and sublimating the solid by-product in a temperature atmosphere of the substrate that is heated.

According to the method of treating the substrate, the first thin film may include a silicon oxide film, the second thin film may include a silicon nitride film, the radical may include a fluorine radical, the second treatment gas may include $NH_3$, and the substrate treatment step may include: generating $(NH_4)_2SiF_6$, which is a solid by-product, by reacting the reaction gas with the silicon oxide film; and sublimating $(NH_4)_2SiF_6$, which is the solid by-product, in a temperature atmosphere of the substrate that is heated.

According to the method of treating the substrate, the radicals constituting the plasma of the first treatment gas may be provided onto the substrate after ions and electrons are removed from the plasma of the first treatment gas.

According to the method of treating the substrate, the first treatment gas may include $NF_3$, $H_2$, or $NH_3$, and the second treatment gas may include $NH_3$ or $H_2$. Furthermore, the first treatment gas or the second treatment gas may further include an inert gas.

According to the method of treating the substrate, the by-product removal step may include pumping an inside of the chamber without supplying the reaction gas onto the substrate.

According to the method of treating the substrate, the substrate treatment step in the unit cycle may be performed only during a process period in which the reaction gas reacts with the first thin film before substantially reacting with the second thin film.

According to another aspect of the present invention, an apparatus for treating a substrate includes: a plasma chamber for providing a plasma generation space for a first treatment gas; a plasma source unit for applying a power to excite the first treatment gas supplied to the plasma chamber into a plasma state; a process chamber provided under the plasma chamber, and having an inner space to which a second treatment gas is supplied; a support unit for supporting the substrate in the inner space; an ion blocker provided between the plasma chamber and the process chamber, and through which radicals constituting plasma of the first treatment gas selectively pass downward; and a control unit for outputting a control signal for controlling gas supply of the first treatment gas and the second treatment gas or controlling power application of the plasma source unit, so that a unit cycle, which includes a substrate treatment step of exposing the substrate to a reaction gas in which the radicals constituting the plasma of the first treatment gas are mixed with the second treatment gas in the inner space, is performed at least one time.

According to the apparatus for treating the substrate, the substrate may include a first thin film, and a second thin film having a lower reactivity to the reaction gas than the first thin film, and in this case, the control unit may output the control signal for controlling the gas supply of the first treatment gas and the second treatment gas or controlling the power application of the plasma source unit, so that the substrate treatment step in the unit cycle is performed only during a process period in which the reaction gas reacts with the first thin film before substantially reacting with the second thin film.

According to the apparatus for treating the substrate, the control unit may output the control signal for controlling the gas supply of the first treatment gas and the second treatment gas or controlling the power application of the plasma source unit, so that the unit cycle further includes exposing the substrate to the second treatment gas without exposing the substrate to the radicals before the substrate treatment step, and preventing the substrate from being exposed to the radicals and the second treatment gas after the substrate treatment step.

According to the apparatus for treating the substrate, the control unit may output a control signal for controlling a pumping unit connected to the process chamber, so that a pressure inside the process chamber in the preventing of the substrate from being exposed to the radicals and the second treatment gas after the substrate treatment step is lower than a pressure inside the process chamber in the substrate treatment step.

The apparatus for treating the substrate may further include a showerhead configured to partition the inner space into a reaction gas generation space for generating the reaction gas in which the radicals are mixed with the second treatment gas, and a treatment space for treating the substrate, and having a plurality of distribution holes through which the reaction gas flows from the reaction gas generation space to the treatment space.

According to the apparatus for treating the substrate, the process chamber and the plasma chamber may contact each other so as to be formed integrally with each other with the ion blocker interposed between the process chamber and the plasma chamber.

According to the apparatus for treating the substrate, the plasma chamber may include a remote plasma chamber spaced apart from the process chamber.

According to the apparatus for treating the substrate, the ion blocker may have a plurality of through-openings through which the radicals generated in the plasma generation space flow into the inner space.

According to the apparatus for treating the substrate, the ion blocker may be grounded to absorb ions and electrons constituting the plasma of the first treatment gas.

According to still another aspect of the present invention, an apparatus for treating a substrate includes: a plasma chamber for providing a plasma generation space for a first treatment gas including fluorine; a plasma source unit for applying a power to excite the first treatment gas supplied to the plasma chamber into a plasma state; a process chamber provided under the plasma chamber, and having an inner space to which a second treatment gas including ammonia is supplied; a support unit for supporting the substrate on which a silicon oxide film and a silicon nitride film are famed in the inner space; an ion blocker provided between the plasma chamber and the process chamber, configured to absorb ions and electrons constituting plasma of the first treatment gas, and through which fluorine radicals constituting the plasma of the first treatment gas selectively pass downward; a showerhead configured to partition the inner space into a reaction gas generation space for generating a reaction gas in which the fluorine radicals are mixed with the second treatment gas including the ammonia, and a treatment space for treating the substrate by using the reaction gas, and having a plurality of distribution holes through which the reaction gas flows from the reaction gas generation space to the treatment space; and a control unit for outputting a control signal for controlling gas supply of the first treatment gas and the second treatment gas or controlling power application of the plasma source unit, so that a unit cycle, which includes a substrate treatment step of exposing the substrate to the reaction gas in the treatment space, is performed at least one time, and the substrate treatment step in the unit cycle is performed only during a process period in which the reaction gas reacts with the silicon oxide film before substantially reacting with the silicon nitride film.

According to one embodiment of the present invention configured as described above, a method of treating a substrate and an apparatus for treating a substrate, capable of implementing a high etching selectivity between mutually different types of thin films, can be provided. However, the scope of the present invention is not limited by the above effect.

DETAILED DESCRIPTION OF THE INVENTION

Figure 1:
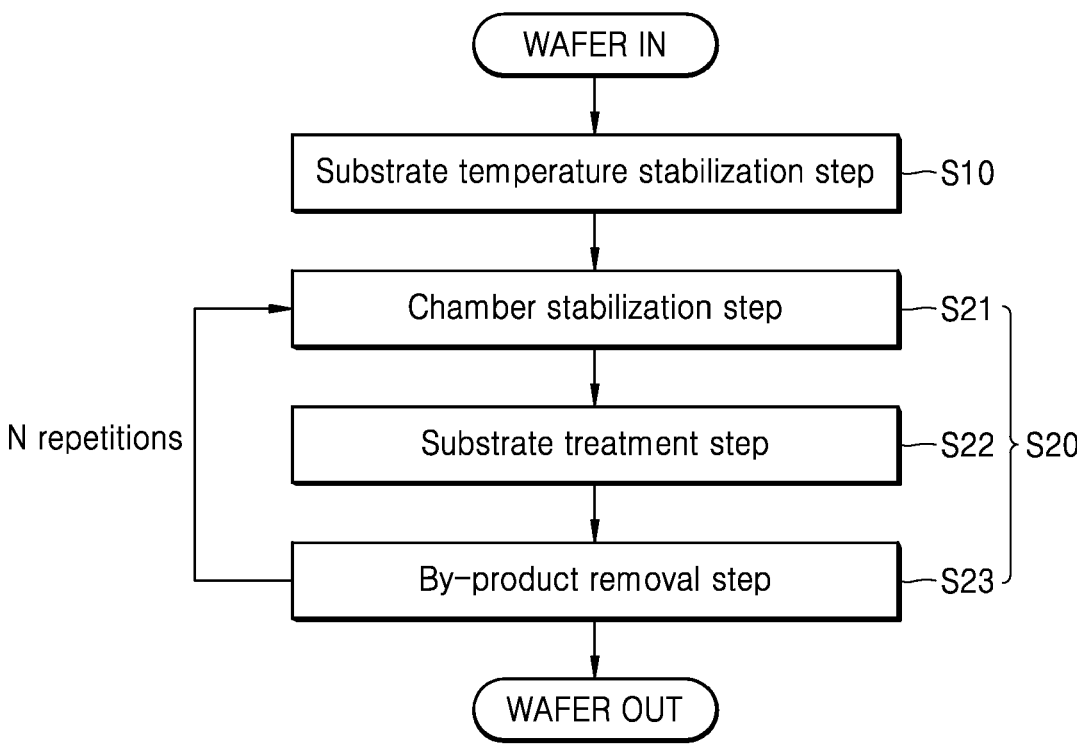
FIG. 1 is a flowchart showing a method of treating a substrate according to one embodiment of the present invention.

Hereinafter, various exemplary embodiments of the present invention will be described in detail with reference to the accompanying drawings.

The embodiments of the present invention are provided to more completely describe the present invention to a person having ordinary skill in the art, the following embodiments may be modified into various other forms, and the scope of the present invention is not limited to the following embodiments. Rather, the embodiments are provided to allow the present disclosure to become thorough and complete, and to fully deliver the idea of the present invention to those skilled in the art. In addition, in the drawings, a thickness or a size of each layer has been exaggerated for convenience and clarity of description.

Hereinafter, embodiments of the present invention will be described with reference to the drawings that schematically show ideal embodiments of the present invention. Variations of a shape shown in the drawings may be expected, for example, depending on a manufacturing technology and/or a tolerance. Therefore, embodiments of the present inventive concept should not be construed as being limited to a specific shape of a region shown in the present disclosure, but should include, for example, changes in the shape caused by manufacture.

Figure 2:
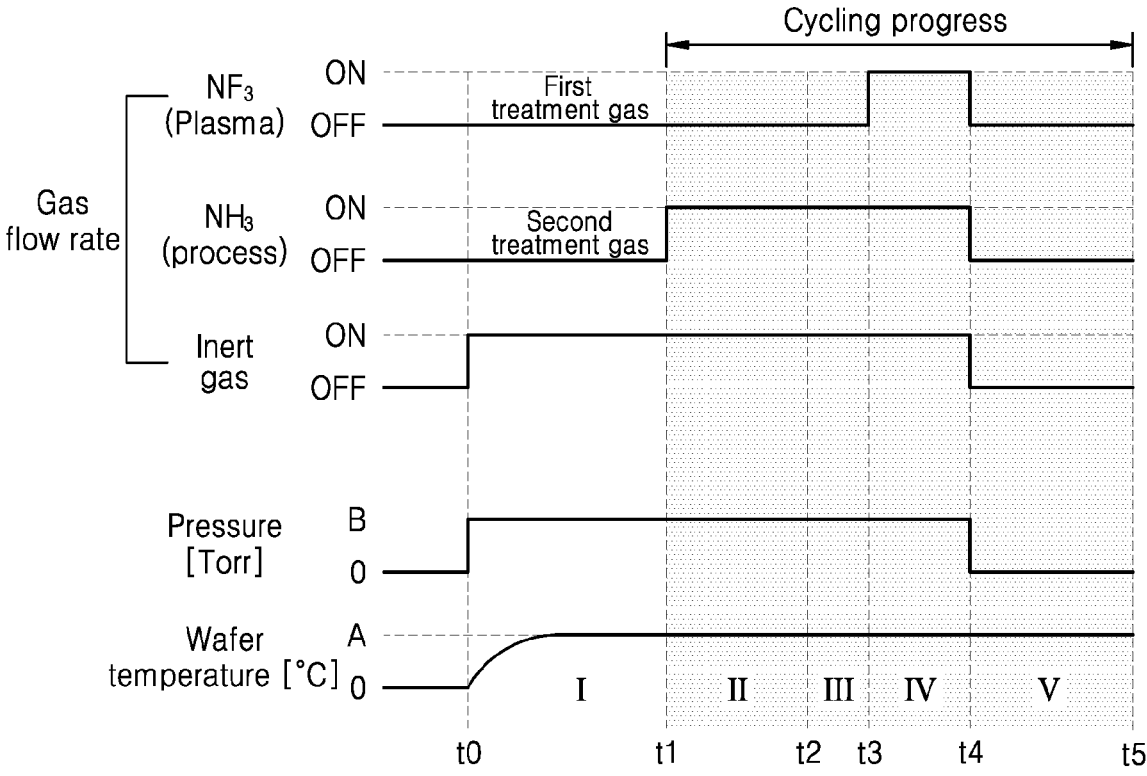
FIG. 2 is a view showing process conditions according to a time in the method of treating the substrate according to one embodiment of the present invention.

FIG. 1 is a flowchart showing a method of treating a substrate according to one embodiment of the present invention, and FIG. 2 is a view showing process conditions according to a time in the method of treating the substrate according to one embodiment of the present invention. In FIG. 2, t0 to t5 corresponding to a horizontal axis may indicate a time at which each step starts or ends.

Referring to FIGS. 1 and 2, according to one embodiment of the present invention, a method of treating a substrate within a chamber may include performing a unit cycle S20 at least one time, in which the unit cycle S20 may include a substrate treatment step S22 of supplying a reaction gas in which radicals constituting plasma of a first treatment gas are mixed with a second treatment gas onto the substrate.

The first treatment gas may be a gas for providing radicals that form a part of the reaction gas. After the first treatment gas is excited into a plasma state, ions and electrons may be filtered out from the plasma, and the radicals may be selectively obtained. The first treatment gas may include, for example, $NF_3$, $H_2$, or $NH_3$. For example, when the first treatment gas is $NF_3$, the radical may be a fluorine radical (F*), and when the first treatment gas is $H_2$ or $NH_3$, the radical may be a hydrogen radical (H*). In detail, when the first treatment gas is $NF_3$, after the first treatment gas is excited into the plasma state, the ions and the electrons may be filtered out from the plasma, and fluorine radicals (F*) may be selectively obtained. The second treatment gas may be a gas for providing a process gas that forms the reaction gas. The second treatment gas may include, for example, $NH_3$ or $H_2$. In detail, when the first treatment gas is $NF_3$, and the second treatment gas is an ammonia ($NH_3$) gas, the reaction gas supplied onto the substrate to treat the substrate may be formed by mixing the fluorine radicals with the ammonia ($NH_3$) gas. According to the method of treating the substrate of one embodiment of the present invention, when the substrate includes a first thin film, and a second thin film having a lower reactivity to the reaction gas than the first thin film, the substrate treatment step S22 in the unit cycle S20 may be performed only during a process period (period from t3 to t4 in FIG. 2) in which the reaction gas reacts with the first thin film before substantially reacting with the second thin film. In this case, since the reaction gas reacts only with the first thin film without reacting with the second thin film, a process selectivity between the first thin film and the second thin film may be increased. In other words, the substrate treatment process may be performed by using a difference between times at which the reaction gas reacts with the first thin film and the second thin film. An operation of stopping a process of generating the reaction gas before the second thin film reacts with the reaction gas may be repeatedly performed to selectively treat one of the first thin film and the second thin film by a specific thickness. In this case, the expression "before the reaction gas reacts with the second thin film" may include a case in which a reaction between the reaction gas and the second thin film is insignificant so as to be negligible in a manufacturing process when taking into consideration a reaction between the reaction gas and the first thin film.

If the substrate treatment step S22 of supplying the reaction gas onto the substrate is performed in excess of the period from t3 to t4 shown in FIG. 2, the reaction gas may react with the second thin film having a relatively lower reactivity as well as the first thin film, so that the process selectivity between the first thin film and the second thin film may be relatively reduced.

Meanwhile, according to one embodiment of the present invention, the substrate treatment step S22 may be performed only during the process period (the period from t3 to t4 in FIG. 2) in which the reaction gas reacts with the first thin film before substantially reacting with the second thin film, but other modified embodiments are also possible.

The process period in which the reaction gas reacts with the first thin film before substantially reacting with the second thin film in the substrate treatment step S22 may indicate, for example, a process period in which the process selectivity of the reaction gas between the first thin film and the second thin film is implemented so as to be significant in the manufacturing process in the substrate treatment step S22.

As a specific example, when the substrate treatment step is a substrate etching step, the substrate treatment step may be adjusted to be performed only during a process period in which a first etching amount by which the first thin film is etched by reacting the reaction gas with the first thin film is implemented as being 4 times or more of a second etching amount by which the second thin film is etched by reacting the reaction gas with the second thin film. Strictly, the substrate treatment step may be adjusted to be performed only during a process period in which the first etching amount by which the first thin film is etched by reacting the reaction gas with the first thin film is implemented as being 10 times or more of the second etching amount by which the second thin film is etched by reacting the reaction gas with the second thin film. In other words, according to a modified embodiment of the present invention, the substrate treatment step may be performed only during a process period in which an etching selectivity of the reaction gas between the first thin film and the second thin film is implemented as being 10 or more.

According to the method of treating the substrate according to one embodiment of the present invention, the substrate treatment step S22 constituting the unit cycle S20 may include: generating a solid by-product by reacting the reaction gas with the first thin film; and sublimating the solid by-product in a temperature atmosphere of the substrate that is heated. In this case, the substrate treatment step may be understood as an etching process step for the first thin film. As a specific example, when the first thin film includes a silicon oxide film, the second thin film includes a silicon nitride film, the radical includes a fluorine radical, and the second treatment gas includes $NH_3$, the substrate treatment step S22 may include: generating $(NH_4)_2SiF_6$, which is a solid by-product, by reacting the reaction gas with the silicon oxide film; and sublimating $(NH_4)_2SiF_6$, which is the solid by-product, in a temperature atmosphere of the substrate that is heated. In this case, the substrate treatment step may be understood as an etching process step for the silicon oxide film. The $(NH_4)_2SiF_6$, which is the solid by-product, may be decomposed and sublimated at 100° C. Since a heater for heating the substrate is installed inside a dielectric plate constituting a support unit on which the substrate is seated, a temperature of the substrate may be set by using the heater so that the solid by-product may be sublimated. A chuck temperature of the support unit on which the substrate is seated may be adjusted, for example, within a range of 0 to 130° C. Meanwhile, the generating of $(NH_4)_2SiF_6$, which is the solid by-product, may be described by the following chemical formula.

$$\text{F Radical} + NH_3(g) + SiO_2 \rightarrow NH_4F \cdot HF + SiO_2 \rightarrow (NH_4)_2SiF_6 + H_2O$$

When describing each step constituting the method of treating the substrate according to one embodiment of the present invention in more detail, after the substrate is carried into the chamber (WAFER IN) so as to be seated on the support unit, first, a substrate temperature stabilization step S10 may be performed. The substrate temperature stabilization step S10 may correspond to a step I in FIG. 2, in which an inert gas (e.g., He, Ar, Xe, etc.) may be supplied into the chamber without supplying the first treatment gas and the second treatment gas into the chamber. In addition, a pressure inside the chamber may be increased from a vacuum state to a process pressure level, and maintained at the process pressure level. The chuck temperature of the support unit on which the substrate is seated may be adjusted, for example, within the range of 0 to 130° C. The substrate temperature stabilization step S10 may be understood as a step that affects reliability of an etching rate of an etching process.

After performing the substrate temperature stabilization step S10, a unit cycle S20 including a chamber stabilization step S21 of supplying the second treatment gas onto the substrate, a substrate treatment step S22, and a by-product removal step S23 of removing a treatment by-product generated in the substrate treatment step may be performed at least one time, and the substrate may be carried out of the chamber (WAFER OUT).

The chamber stabilization step S21 of supplying the second treatment gas onto the substrate without supplying the first treatment gas may correspond to a step II (pressure stabilization step) and a step III (gas stabilization step) in FIG. 2. The step II (pressure stabilization step) may be a step of adjusting a chamber process pressure within a short time, in which the second treatment gas may be started to be supplied onto the substrate. The step III (gas stabilization step) may be a step that affects reliability of an etching rate.

The substrate treatment step S22 may be a step that affects an etching amount, and may correspond to a step IV (etching step) in FIG. 2. It has been described above that a high selectivity between a silicon oxide film and a silicon nitride film may be implemented by adjusting a process time from t3 to t4 in which the substrate treatment step S22 is performed. In other words, an operation of stopping a process of generating a reaction gas, which is an etchant, before the silicon nitride film reacts with the reaction gas may be repeatedly performed to etch the silicon oxide film by a sufficient thickness without etching the silicon nitride film.

The by-product removal step S23 of removing the treatment by-product generated in the substrate treatment step may correspond to a step V (pumping step) in FIG. 2. In other words, the by-product removal step S23 may include pumping an inside of the chamber without supplying the reaction gas onto the substrate. The treatment by-product generated in the substrate treatment step may exist as, for example, a gaseous material obtained by sublimating solid $(NH_4)_2SiF_6$.

According to the method of treating the substrate according to one embodiment of the present invention, the inert gas may be supplied into the chamber during the substrate temperature stabilization step S10, the chamber stabilization step S21, and the substrate treatment step S22, while the inert gas may not be supplied into the chamber in the by-product removal step S23 that is the pumping of the inside of the chamber. Meanwhile, according to a method of treating a substrate of a modified embodiment of the present invention, the inert gas may be supplied into the chamber throughout the substrate temperature stabilization step S10, the chamber stabilization step S21, the substrate treatment step S22, and the by-product removal step S23 that is the pumping of the inside of the chamber.

Hereinafter, an apparatus for treating a substrate according to various embodiments of the present invention, which is capable of implementing the method of treating the substrate described above, will be described. According to the present embodiment, an apparatus for treating a substrate to perform dry cleaning, cleaning, or etching on the substrate by using plasma within a chamber will be described as one example. However, the present invention is not limited thereto, and an apparatus for treating a substrate by using plasma may be applied to various processes.

Figure 3:
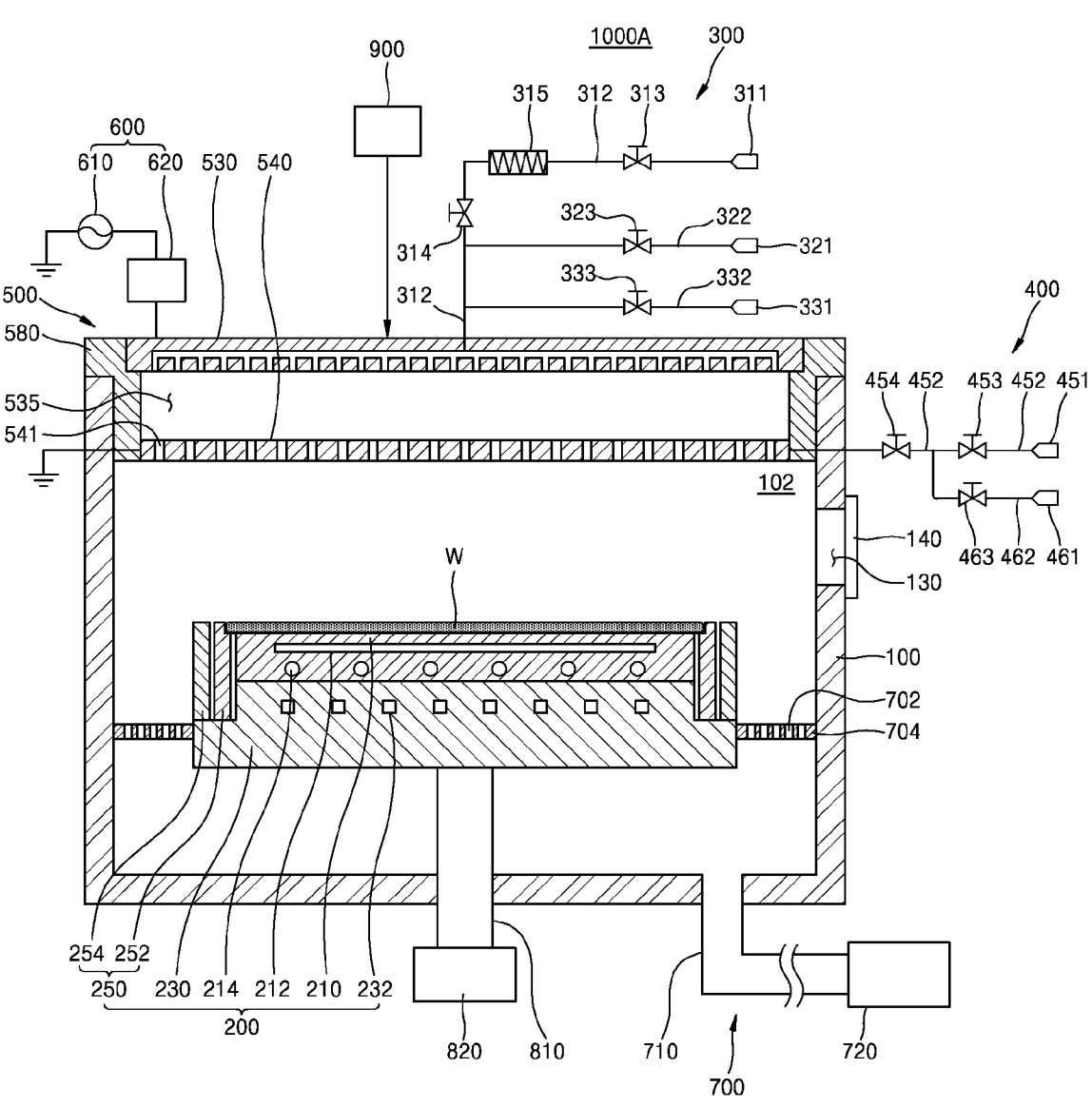
FIG. 3 is a view showing a configuration of an apparatus for treating a substrate according to a first embodiment of the present invention.
Figure 4:
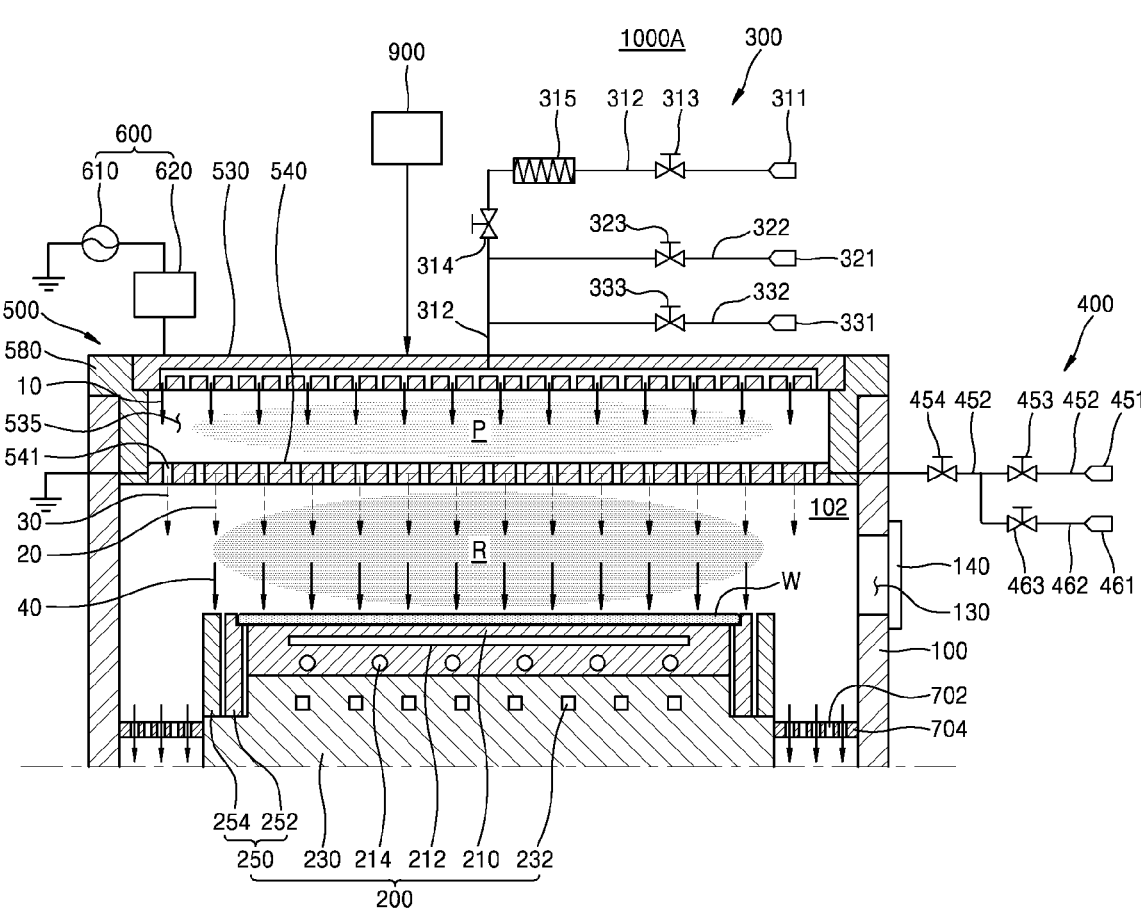
FIG. 4 is a view showing a partial configuration and an operation state of the apparatus for treating the substrate according to the first embodiment of the present invention.

FIG. 3 is a view showing a configuration of an apparatus for treating a substrate according to a first embodiment of the present invention, and FIG. 4 is a view showing a partial configuration and an operation state of the apparatus for treating the substrate according to the first embodiment of the present invention.

Referring to FIGS. 3 and 4, an apparatus 1000A for treating a substrate may include a process chamber 100, a support unit 200, a first treatment gas supply unit 300, a second treatment gas supply unit 400, a plasma source unit 600 (i.e., a plasma power source), and a pumping unit 700.

The process chamber 100 may have an inner space 102. A treatment space of the inner space 102 may provide a space in which a substrate W is treated. The process chamber 100 may have a circular cylindrical shape. The process chamber 100 may be famed of a metal material. For example, the process chamber 100 may be formed of an aluminum material. An opening 130 may be formed in one side wall of the process chamber 100. The opening 130 may be provided as an entrance through which the substrate W may be carried in and out. The opening 130 may be opened and closed by a door 140.

The support unit 200 may be provided in the inner space 102 to support the substrate W. The support unit 200 may be provided as an electrostatic chuck for supporting the substrate W by using an electrostatic force. The support unit 200 may ascend and descend in a vertical direction within the process chamber 100 by an operation of a driving unit 820 connected to a support shaft 810.

According to one embodiment, the support unit 200 may include a dielectric plate 210, a focus ring 250, and a base 230. The substrate W may be directly placed on a top surface of the dielectric plate 210. The dielectric plate 210 may have a disc shape. The dielectric plate 210 may have a smaller radius than the substrate W. An inner electrode 212 may be installed inside the dielectric plate 210. A power source (not shown) may be connected to the inner electrode 212, and a power may be applied from the power source (not shown). The inner electrode 212 may provide an electrostatic force from the applied power to allow the substrate W to be adsorbed to the dielectric plate 210. A heater 214 for heating the substrate W may be installed inside the dielectric plate 210. The heater 214 may be located under the inner electrode 212. The heater 214 may be provided as a coil having a spiral shape. For example, the dielectric plate 210 may be formed of a ceramic material.

The base 230 may support the dielectric plate 210. The base 230 may be located under the dielectric plate 210, and fixedly coupled to the dielectric plate 210. A top surface of the base 230 may have a stepped shape such that a central region of the top surface of the base 230 may be higher than an edge region of the top surface of the base 230. The central region of the top surface of the base 230 may have an area corresponding to a bottom surface of the dielectric plate 210. A cooling passage 232 may be formed inside the base 230. The cooling passage 232 may be provided as a passage through which a cooling fluid circulates. The cooling passage 232 may be provided inside the base 230 in a spiral shape. The base 230 may be electrically grounded. However, according to an embodiment that is not shown in the drawings, the base 230 may be connected to a high-frequency power source (not shown) located outside. The base 230 may be formed of a metal material.

The focus ring 250 may surround outer peripheries of the dielectric plate 210 and the substrate W. The focus ring 250 may concentrate plasma (or a reaction gas in which radicals are mixed with a second treatment gas) to the substrate W. According to one embodiment, the focus ring 250 may include an inner ring 252 and an outer ring 254. An inner upper portion of the inner ring 252 may be stepped so that an edge of the substrate W may be placed on the stepped portion. The focus ring 250 may be a ring at a periphery of an electrostatic chuck (ESC) on which a wafer is placed, may be manufactured within a range where particles are not generated by etching, and may include a silicon oxide film ($SiO_2$), a silicon single crystal, a silicon fluoride film (SiF), or the like. In addition, the focus ring 250 may be replaced when abraded.

The plasma source unit 600 may be provided as, for example, a capacitively coupled plasma source. The plasma source unit 600 may include a high-frequency power source 610 and an impedance matcher 620.

The plasma chamber 500 provided on the process chamber 100 may provide a plasma generation space 535 for a gas. An upper electrode 530 and an ion blocker 540 may face each other, and the upper electrode 530 may be disposed on the ion blocker 540. The ion blocker 540 may be understood as a sort of a showerhead. The plasma generation space 535 may be foiled between the upper electrode 530 and the ion blocker 540. The inner space 102 of the process chamber 100 may be separated from the plasma generation space 535 of the plasma chamber 500 by the ion blocker 540. A side wall ring 580 provided as an insulator may be provided on a side surface of the plasma generation space 535. The upper electrode 530, the ion blocker 540, and the side wall ring 580 may be combined with each other to form the plasma generation space 535 therein. The plasma generation space 535 may be connected to the first treatment gas supply unit 300 for supplying a first treatment gas.

The first treatment gas supply unit 300 may include a first gas supply source 311 and a first gas supply line 312, and flow rate adjustment members 313 and 314 and a heating member 315 may be provided in the first gas supply line 312. The first gas supply source 311 may store a first gas. The first gas may be a fluorine component-containing gas. According to one embodiment, the first gas may be $NF_3$. The first gas supply line 312 may be provided as a fluid passage for connecting the first gas supply source 311 to the plasma chamber 500. The first gas supply line 312 may supply the first gas stored in the first gas supply source 311 to the plasma generation space 535 of the plasma chamber 500. In order to further supply a gas mixed with the first gas, the first treatment gas supply unit 300 may further include a second gas supply source 321 for supplying a second gas that is different from the first gas, or a third gas supply source 331 for supplying a third gas that is different from the first gas and the second gas. The second gas supply source 321 may be connected to the first gas supply line 312 through a second gas supply line 322. The third gas supply source 331 may be connected to the first gas supply line 312 through a third gas supply line 332. A flow rate adjustment member 323 may be installed in the second gas supply line 322. A flow rate adjustment member 333 may be installed in the third gas supply line 332. The second gas may be an inert gas. For example, the second gas may be argon (Ar). The third gas may be an inert gas that is different from the second gas. For example, the third gas may be helium (He). The first treatment gas may be defined by a combination of the first gas and at least one of the second gas and the third gas. Alternatively, the first gas may be solely defined as the first treatment gas. The first treatment gas may be a mixed gas in which additional gases are mixed in addition to the proposed embodiment.

The heating member 315 may be provided in the first gas supply line 312. The heating member 315 may heat the first treatment gas. An operation of the heating member 315 may be controlled by a control unit 900 (i.e., a controller or a control circuit), and the control unit 900 may control the heating member 315 so that the heating member 315 may heat the first treatment gas to a temperature immediately before thermal decomposition of the first treatment gas. The temperature immediately before the thermal decomposition of the first treatment gas may be a temperature that varies depending on an atmosphere in which the first treatment gas is heated, such as a type of the first treatment gas and a pressure of the supply line, while having a sufficient temperature interval (e.g., a temperature interval within a range of about 20 to 100° C. less than a pyrolysis temperature) with the pyrolysis temperature (more specifically, a temperature at which pyrolysis starts to actively occur). According to one embodiment, a pyrolysis temperature of the first treatment gas may be calculated by reading a pressure of the first gas supply line 312 in which the heating member 315 is provided, and the first treatment gas may be heated to have a sufficient temperature interval with a value obtained by the calculation. For example, when the first treatment gas is NF3, a thermal decomposition temperature may be 600° C., so that the heating member 315 may be controlled to heat the first treatment gas to 500 to 580° C. The heating member 315 may be provided upstream or downstream of the first gas supply line 312 to which the second gas supply line 322 or the third gas supply line 332 is connected. In the drawings, an embodiment in which the heating member 315 is provided upstream of the first gas supply line 312 to which the second gas supply line 322 or the third gas supply line 332 is connected has been shown.

According to one embodiment of the present invention, while using plasma for a substrate treatment such as dry cleaning, the first treatment gas heated to a level immediately before the thermal decomposition maybe excited, so that plasma energy required to generate radicals may be reduced, and thus particles generated from components constituting a plasma source (e.g., an electrode, a showerhead, an insulator, etc.) may be suppressed, and lifespans of the components constituting the plasma source may be extended so as to extend replacement cycles of the components. In addition, plasma may be generated by an electric or electromagnetic plasma source, so that generation and suppression of the plasma may be controlled at a high speed, and thus a precise process may be performed.

Meanwhile, according to a modified embodiment of the present invention, the heating member 315 may not be provided in the first gas supply line 312.

The high-frequency power source 610 may be connected to the upper electrode 530. The high-frequency power source 610 may apply a high-frequency power to the upper electrode 530. The impedance matcher 620 may be provided between the high-frequency power source 610 and the upper electrode 530.

An electromagnetic field generated between the upper electrode 530 and the ion blocker 540 may excite the heated first treatment gas provided into the plasma generation space 535 into a plasma state. The heated first treatment gas introduced into the plasma generation space 535 may be transitioned into the plasma state. The first treatment gas may be decomposed into ions, electrons, and radicals as the first treatment gas transitions into the plasma state. A radical component that is generated may pass through the ion blocker 540 to move to the inner space 102.

The ion blocker 540 may be provided between the plasma generation space 535 and the inner space 102, and may form a boundary between the plasma generation space 535 and the inner space 102. In other words, the ion blocker 540 may be provided between the plasma chamber 500 and the process chamber 100. The ion blocker 540 may be formed of a conductive material. The ion blocker 540 may have a plate shape. For example, the ion blocker 540 may have a disc shape. The ion blocker 540 may have a plurality of through-openings 541. The through-openings 541 may cross the ion blocker 540 in the vertical direction. The ion blocker 540 may be grounded. Since the ion blocker 540 is grounded, ions and electrons among plasma components passing through the ion blocker 540 may be absorbed to the ion blocker 540. In other words, the ion blocker 540 may function as an ion blocker that blocks passage of the ions. Since the ion blocker 540 is grounded, only radicals among the plasma components may pass through the ion blocker 540.

The second treatment gas supply unit 400 for supplying the second treatment gas may be connected to the inner space 102 of the process chamber 100. The second treatment gas supply unit 400 may include a fourth gas supply source 451 and a fourth gas supply line 452. Flow rate adjustment members 453 and 454 may be installed in the fourth gas supply line 452. The fourth gas supply source 451 may store a fourth gas. The fourth gas may be a nitrogen- or hydrogen-containing gas. According to one embodiment, the fourth gas may be $NH_3$. The fourth gas supply line 452 may be provided as a fluid passage for connecting the fourth gas supply source 451 to the process chamber 100. The fourth gas supply line 452 may supply the fourth gas stored in the fourth gas supply source 451 to the inner space 102 of the process chamber 100. In order to further supply a gas mixed with the fourth gas, the second treatment gas supply unit 400 may further include a fifth gas supply source 461 for supplying a fifth gas that is different from the fourth gas. The fifth gas supply source 461 may be connected to the fourth gas supply source 451 through a fifth gas supply line 462. A flow rate adjustment member 463 may be installed in the fifth gas supply line 462. The fifth gas may be a nitrogen- or hydrogen-containing gas. For example, the fifth gas may be $H_2$. The second treatment gas may be defined by a combination of the fourth gas and the fifth gas. Alternatively, the fourth gas may be solely defined as the second treatment gas. The second treatment gas may be a mixed gas in which additional gases are mixed in addition to the proposed embodiment.

The second treatment gas introduced into the inner space 102 may react with the plasma generated from the first treatment gas so as to generate a reaction gas. In more detail, the radicals that have passed through the ion blocker 540 in the plasma generated from the first treatment gas in the plasma generation space 535 may react with the second treatment gas so as to generate the reaction gas in the inner space 102. According to one example, the radical in the plasma generated from the first treatment gas may be a fluorine radical (F*), the second treatment gas may be a mixed gas of $NH_3$ and $H_2$, and the reaction gas may be $NH_4FHF$ (ammonium hydrogen fluoride). The reaction gas may remove the silicon oxide film on the substrate.

An exhaust baffle 704 may uniformly exhaust the plasma for each region in a treatment space that is the inner space 102 of the process chamber 100. The exhaust baffle 704 may be located between an inner side wall of the process chamber 100 and the support unit 200 for the substrate in the treatment space. The exhaust baffle 704 may have an annular ring shape. The exhaust baffle 704 may have a plurality of through-holes 702. The through-holes 702 may face in the vertical direction. The through-holes 702 may be arranged in a circumferential direction of the exhaust baffle 704. The through-holes 702 may have a slit shape, and may have a longitudinal direction directed in a radial direction of the exhaust baffle 704. An exhaust pump 720 for exhausting a treatment by-product and a pumping unit 700 including a pump line 710 may be installed downstream of the exhaust baffle 704 of the process chamber 100. The exhaust pump 720 may provide a vacuum pressure inside the process chamber 100. The treatment by-product generated during the process and the treatment gas or the reaction gas remaining in the process chamber 100 may be discharged to an outside of the process chamber 100 by the vacuum pressure. An opening/closing valve (not shown) may adjust an exhaust pressure provided from the exhaust pump 720. The opening/closing valve may open and close an exhaust port. The opening/closing valve may move to an open position and a blocking position. In this case, the open position may be a position where the exhaust port is opened by the opening/closing valve, and the blocking position may be a position where the exhaust port is blocked by the opening/closing valve. An opening degree of a valve of the opening/closing valve may be adjusted by the control unit 900.

An operation state of the apparatus for treating the substrate according to the first embodiment of the present invention will be described with reference to FIG. 4. A first treatment gas 10 may be uniformly supplied to the plasma generation space 535, and the first treatment gas 10 may be excited into a plasma (P) state in the plasma generation space 535. Ions and electrons among components of plasma P may be absorbed by the grounded ion blocker 540, and radicals 30 among the components of the plasma P may pass through the through-openings 541 so as to be introduced into the inner space 102 of the process chamber 100. The introduced radicals 30 may react with a second treatment gas 20 supplied to the inner space 102 so as to form a reaction gas 40 (R), and the reaction gas 40 may treat the substrate W.

Figure 5:
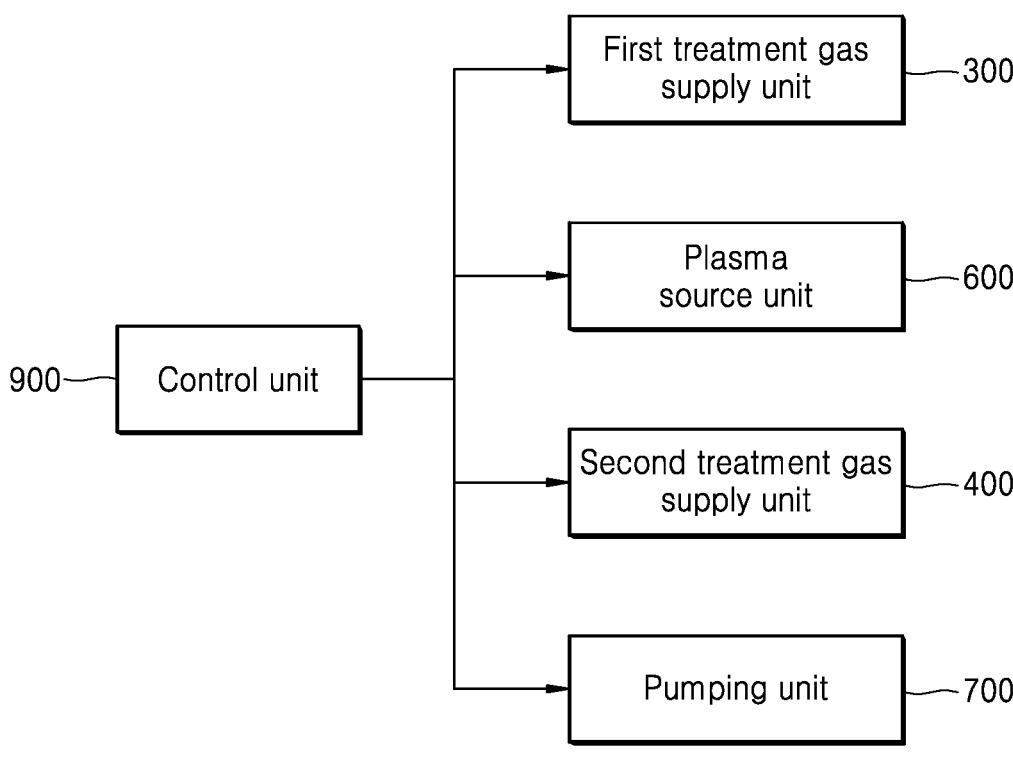
FIG. 5 is a view showing control components connected to a control unit in an apparatus for treating a substrate according to embodiments of the present invention.

FIG. 5 is a view showing control components connected to a control unit in an apparatus for treating a substrate according to embodiments of the present invention.

Referring to FIG. 5, the control unit 900 may control at least one of the first treatment gas supply unit 300, the second treatment gas supply unit 400, the plasma source unit 600, and the pumping unit 700. In detail, the control unit 900 may output a control signal for controlling at least one of the flow rate adjustment members 313 and 314, the flow rate adjustment member 323, the flow rate adjustment member 333, and the heating member 315, which constitute the first treatment gas supply unit 300, so as to control gas supply of the first treatment gas. The control unit 900 may output a control signal for controlling at least one of the flow rate adjustment members 453 and 454 and the flow rate adjustment member 463, which constitute the second treatment gas supply unit 400, so as to control gas supply of the second treatment gas. The control unit 900 may output a control signal for controlling at least one of the high-frequency power sources 610 and the impedance matcher 620, which constitute the plasma source unit 600, so as to control power application of the plasma source unit. The control unit 900 may output a control signal for controlling at least one of the exhaust pump 720 and the opening/closing valve (not shown), which constitute the pumping unit 700, so as to control a pressure inside the process chamber 100.

In order to perform the method of treating the substrate described with reference to FIGS. 1 and 2, an apparatus for treating a substrate according to embodiments of the present invention may include a control unit 900 for outputting a control signal for controlling gas supply of the first treatment gas and the second treatment gas or controlling power application of the plasma source unit.

For example, the control unit 900 may: i) output the control signal for controlling at least one of the flow rate adjustment members 313 and 314, the flow rate adjustment member 323, the flow rate adjustment member 333, and the heating member 315, which constitute the first treatment gas supply unit 300, so as to control the gas supply of the first treatment gas; ii) output the control signal for controlling at least one of the flow rate adjustment members 453 and 454 and the flow rate adjustment member 463, which constitute the second treatment gas supply unit 400, so as to control the gas supply of the second treatment gas; and iii) output the control signal for controlling at least one of the high-frequency power source 610 and the impedance matcher 620, which constitute the plasma source unit 600, so as to control the power application of the plasma source unit, so that a unit cycle, which includes a substrate treatment step of exposing the substrate to a reaction gas in which the radicals constituting the plasma of the first treatment gas are mixed with the second treatment gas in the inner space, may be performed at least one time, furthermore, so that a unit cycle shown in FIG. 1 may be performed at least one time, and more specifically, so that when the substrate includes a first thin film, and a second thin film having a relatively lower reactivity to the reaction gas than the first thin film, the substrate treatment step in the unit cycle may be performed only during a process period in which the reaction gas reacts with the first thin film before substantially reacting with the second thin film.

Furthermore, while performing the method of treating the substrate described above, the control unit 900 may output the control signal for controlling at least one of the exhaust pump 720 and the opening/closing valve (not shown), which constitute the pumping unit 700, so as to control the pressure inside the process chamber 100, so that a pressure inside the process chamber in preventing of the substrate from being exposed to the radicals and the second treatment gas after the substrate treatment step may be relatively lower than a pressure inside the process chamber in the substrate treatment step.

Figure 6:
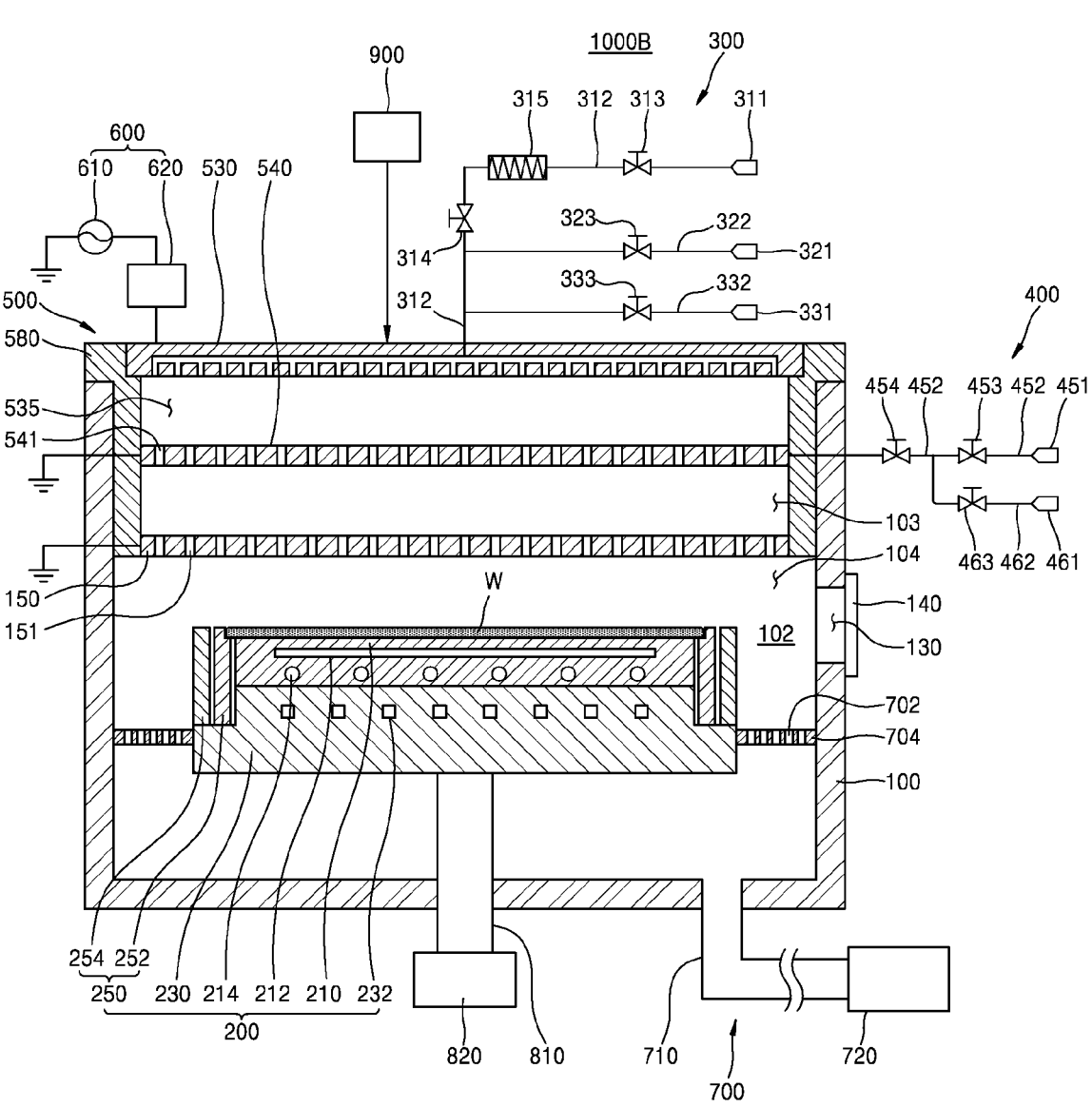
FIG. 6 is a view showing a configuration of an apparatus for treating a substrate according to a second embodiment of the present invention.
Figure 7:
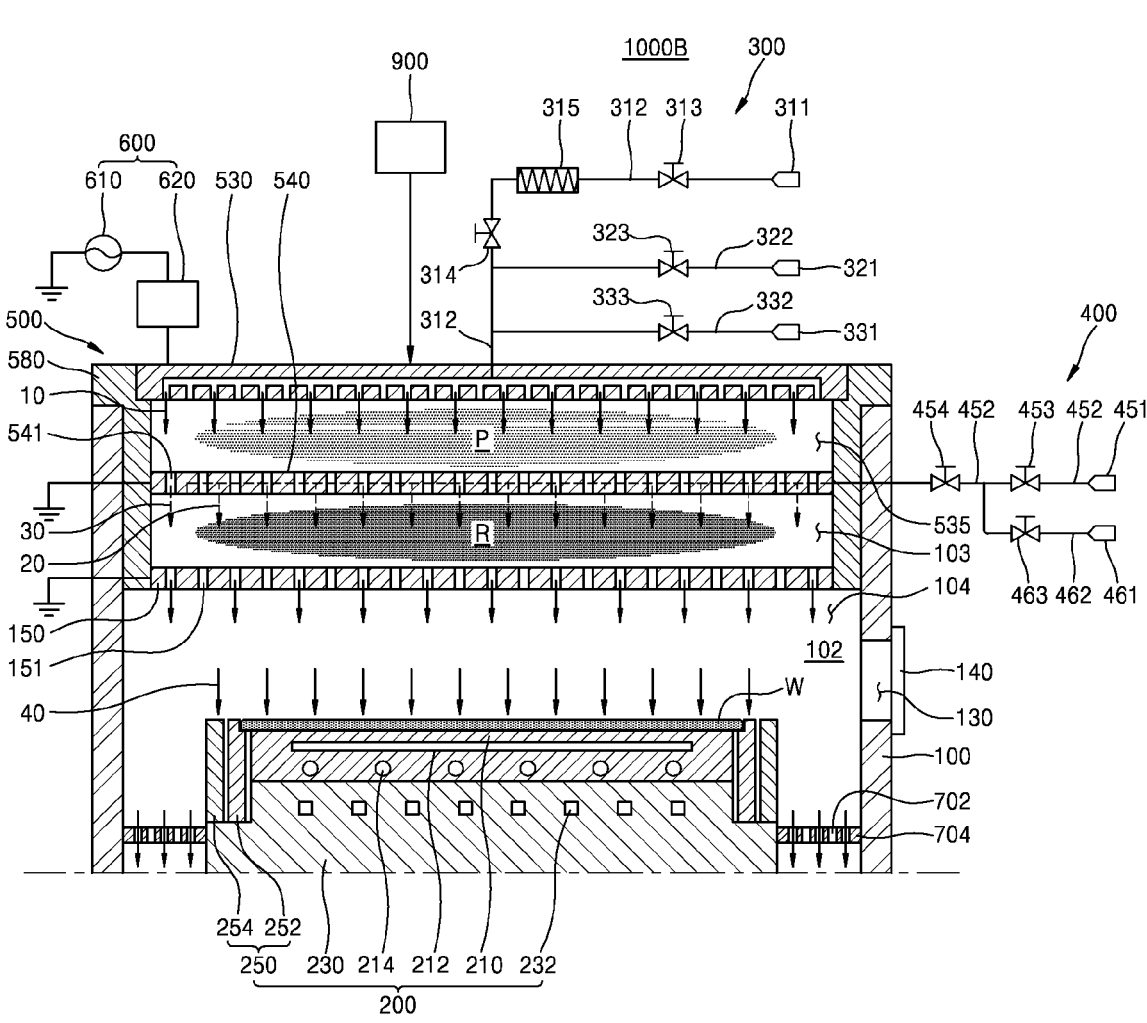
FIG. 7 is a view showing a partial configuration and an operation state of the apparatus for treating the substrate according to the second embodiment of the present invention.

FIG. 6 is a view showing a configuration of an apparatus for treating a substrate according to a second embodiment of the present invention, and FIG. 7 is a view showing a partial configuration and an operation state of the apparatus for treating the substrate according to the second embodiment of the present invention.

Hereinafter, components of the second embodiment that are different from the components of the first embodiment will be described, while descriptions of components of the second embodiment that are identical to the components of the first embodiment will be replaced with the descriptions of the first embodiment. The components of the second embodiment that are identical to the components of the first embodiment will be denoted by the same reference numerals in the drawings.

Referring to FIGS. 6 and 7, an apparatus 1000B for treating a substrate according to a second embodiment of the present invention may include a process chamber 100, a support unit 200, a first treatment gas supply unit 300, a second treatment gas supply unit 400, a plasma source unit 600, and a pumping unit 700, and unlike the first embodiment, the apparatus 1000B for treating the substrate may further include a showerhead 150.

The showerhead 150 may have a plate shape. For example, the showerhead 150 may have a disc shape. The showerhead 150 may be disposed under the ion blocker 540 to face the ion blocker 540. The showerhead 150 may classify and divide the inner space 102 of the process chamber 100 into a reaction gas generation space 103 for generating the reaction gas in which the radicals are mixed with the second treatment gas, and a treatment space 104 for treating the substrate. The showerhead 150 may have a plurality of distribution holes 151 through which the reaction gas flows from the reaction gas generation space 103 to the treatment space 104.

The reaction gas generation space 103 may be formed between the showerhead 150 and the ion blocker 540. A side wall ring 580 provided as an insulator may be provided on side surfaces of the plasma generation space 535 and the reaction gas generation space 103. The upper electrode 530, the ion blocker 540, and the side wall ring 580 may be combined with each other to form the plasma chamber 500 in which the plasma generation space 535 is formed, and the ion blocker 540, the showerhead 150, and the side wall ring 580 may be combined with each other to form a reaction gas generation chamber.

The second treatment gas supply unit 400 may supply the second treatment gas to the reaction gas generation space 103. In the reaction gas generation space 103, the radicals generated from the first treatment gas may react with the second treatment gas so as to generate the reaction gas. According to one embodiment, the radicals that have passed through the ion blocker 540 in the plasma generated from the first treatment gas may react with the second treatment gas in the reaction gas generation space 103 so as to generate the reaction gas.

A bottom surface of the showerhead 150 may be exposed to the treatment space 104. The showerhead 150 may have a plurality of distribution holes 151. Each of the distribution holes 151 may be formed through the showerhead 150 in the vertical direction. The reaction gas may be supplied to the treatment space 104 through the distribution holes 151. For example, the showerhead 150 may be formed of a conductive material, and may be grounded. The showerhead 150 may discharge the reaction gas to the treatment space 104. The showerhead 150 may be disposed on the support unit 200. The showerhead 150 may face the dielectric plate 210. The reaction gas that has passed through the showerhead 150 may be uniformly supplied to the treatment space 104 so as to treat the substrate.

Control components connected to the control unit 900 in the apparatus 1000B for treating the substrate according to the second embodiment of the present invention may be the same as the control components described with reference to FIG. 5.

Unlike the apparatus 1000A for treating the substrate according to the first embodiment of the present invention, the apparatus 1000B for treating the substrate according to the second embodiment of the present invention may partition the inner space 102 of the process chamber 100 into the reaction gas generation space 103 for generating the reaction gas in which the radicals are mixed with the second treatment gas, and the treatment space 104 for treating the substrate, so that uniformity of the reaction gas in the treatment space 104 for treating the substrate may be improved.

Figure 8:
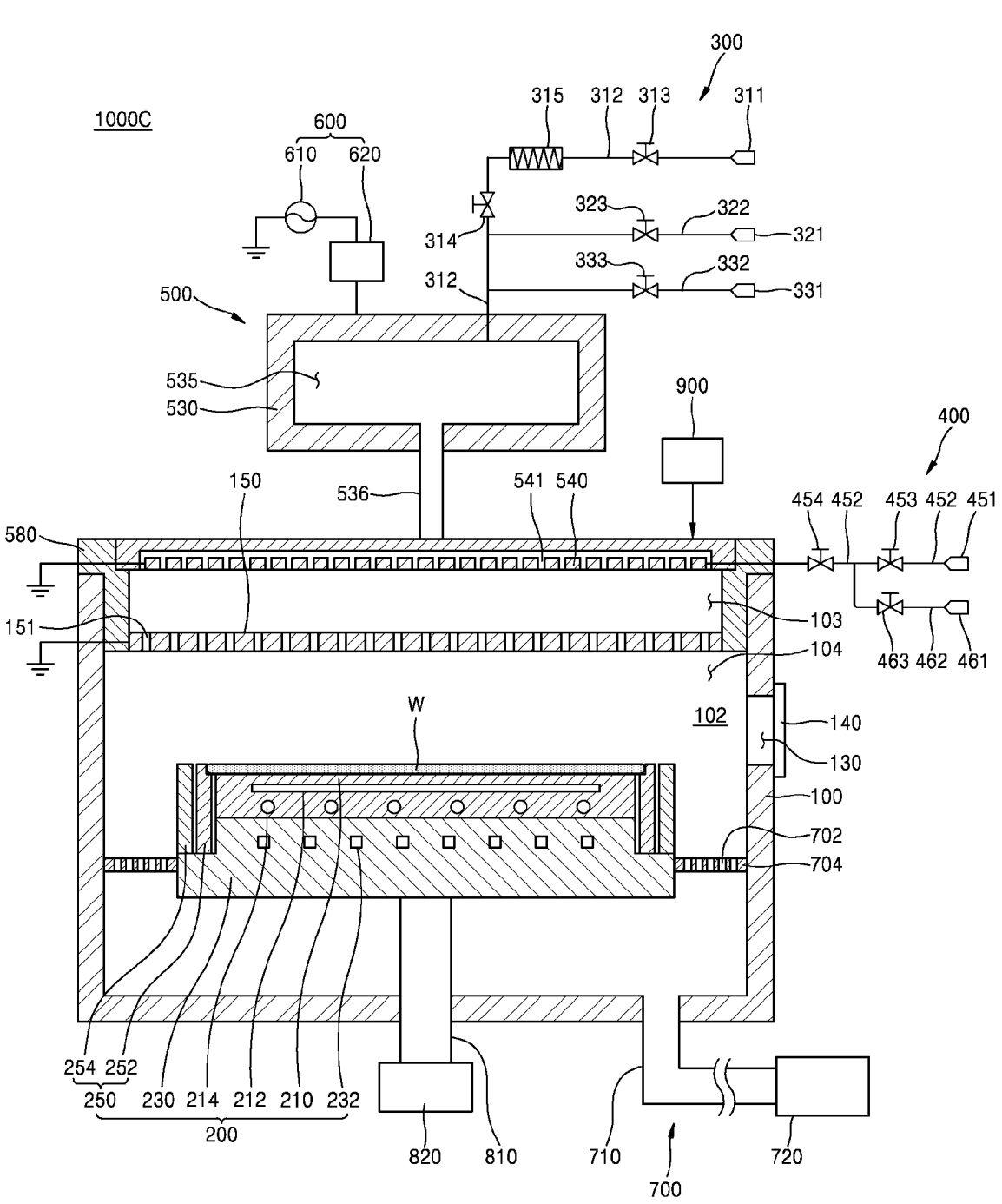
FIG. 8 is a view showing a configuration of an apparatus for treating a substrate according to a third embodiment of the present invention.
Figure 9:
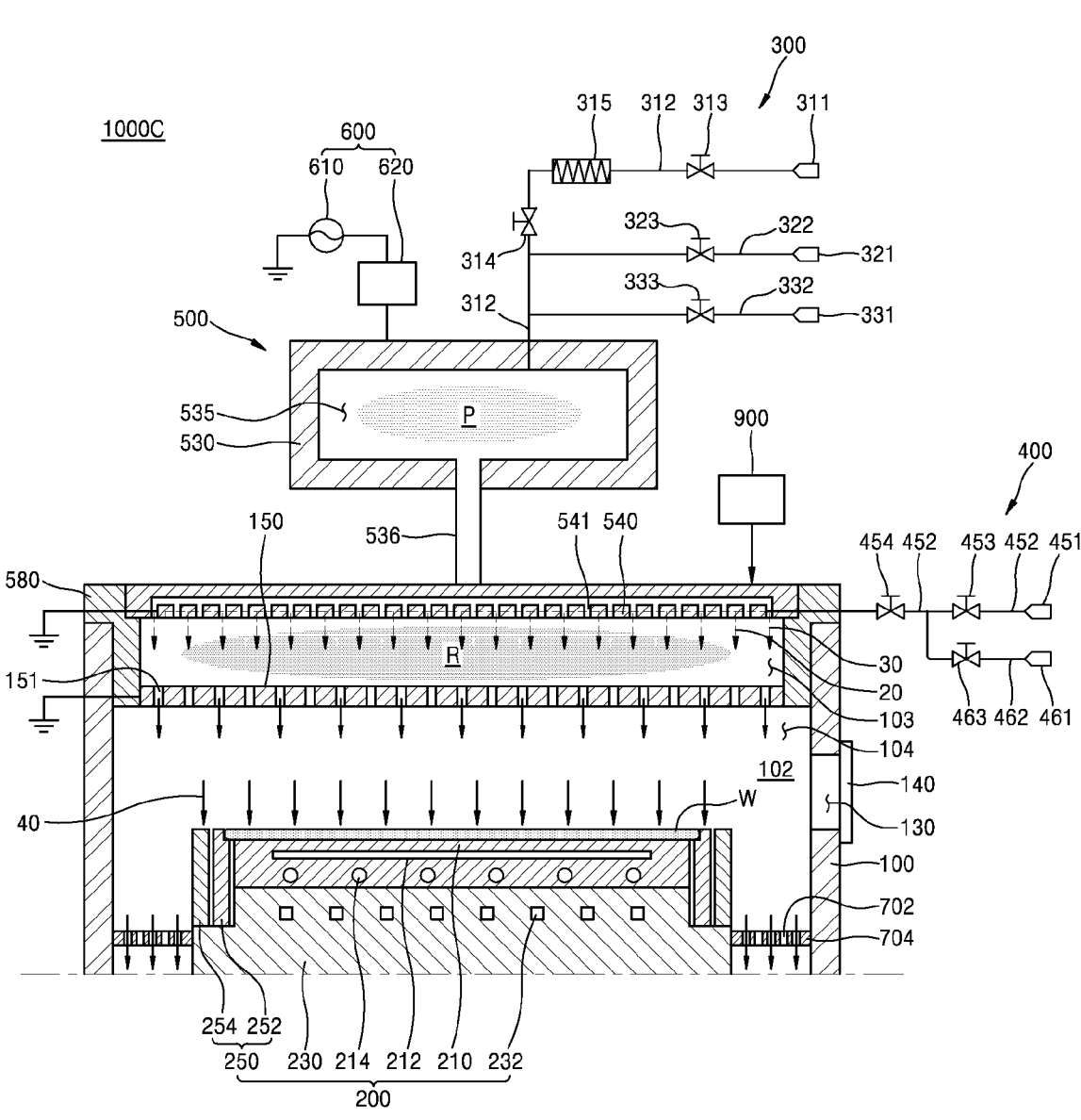
FIG. 9 is a view showing a partial configuration and an operation state of the apparatus for treating the substrate according to the third embodiment of the present invention.

FIG. 8 is a view showing a configuration of an apparatus 1000C for treating a substrate according to a third embodiment of the present invention, and FIG. 9 is a view showing a partial configuration and an operation state of the apparatus 1000C for treating the substrate according to the third embodiment of the present invention. Hereinafter, components of the third embodiment that are different from the components of the first embodiment or the second embodiment will be described, while descriptions of components of the third embodiment that are identical to the components of the first embodiment or the second embodiment will be replaced with the descriptions of the first embodiment and the second embodiment. The components of the third embodiment that are identical to the components of the first embodiment and the second embodiment will be denoted by the same reference numerals in the drawings.

While the apparatuses for treating the substrates according to the first and second embodiments of the present invention are configured such that the process chamber 100 and the plasma chamber 500 contact each other so as to be formed integrally with each other with the ion blocker 540 interposed between the process chamber 100 and the plasma chamber 500, the apparatus for treating the substrate according to the third embodiment may be configured such that the plasma chamber 500 is a remote plasma chamber spaced apart from the process chamber 100.

Referring to FIGS. 8 and 9, the plasma source unit 600 and the first treatment gas supply unit 300 may be connected to a plasma chamber 500 disposed on the process chamber 100 while being spaced apart from the process chamber 100. The plasma source unit 600 may apply a power to excite the first treatment gas supplied to the plasma chamber 500 into a plasma state. The plasma chamber 500 may provide a plasma generation space 535 for the first treatment gas. The plasma P generated in the plasma chamber 500 may flow to the ion blocker 540 through a connection pipe 536. The second treatment gas supply unit 400 may supply the second treatment gas to the reaction gas generation space 103. In the reaction gas generation space 103, the radicals generated from the first treatment gas may react with the second treatment gas so as to generate a reaction gas R. According to one embodiment, the radicals that have passed through the ion blocker 540 in the plasma generated from the first treatment gas may react with the second treatment gas in the reaction gas generation space 103 so as to generate the reaction gas R.

A bottom surface of the showerhead 150 may be exposed to the treatment space 104. The showerhead 150 may have a plurality of distribution holes 151. Each of the distribution holes 151 may be formed through the showerhead 150 in the vertical direction. The reaction gas may be supplied to the treatment space 104 through the distribution holes 151. For example, the showerhead 150 may be formed of a conductive material, and may be grounded. The showerhead 150 may discharge the reaction gas to the treatment space 104. The showerhead 150 may be disposed on the support unit 200. The showerhead 150 may face the dielectric plate 210. The reaction gas that has passed through the showerhead 150 may be uniformly supplied to the treatment space 104 so as to treat the substrate.

Control components connected to the control unit 900 in the apparatus 1000C for treating the substrate according to the third embodiment of the present invention may be the same as the control components described with reference to FIG. 5.

Unlike the apparatuses 1000A and 1000B for treating the substrates according to the first and second embodiments, the apparatus 1000C for treating the substrate according to the third embodiment of the present invention may be configured such that the plasma chamber 500 is a remote plasma chamber spaced apart from the process chamber 100, so that substrate contamination caused by particles generated from components constituting a plasma source (e.g., an electrode, a showerhead, an insulator, etc.) may be suppressed, and lifespans of components constituting the process chamber may be extended so as to extend replacement cycles of the components.

Figure 10:
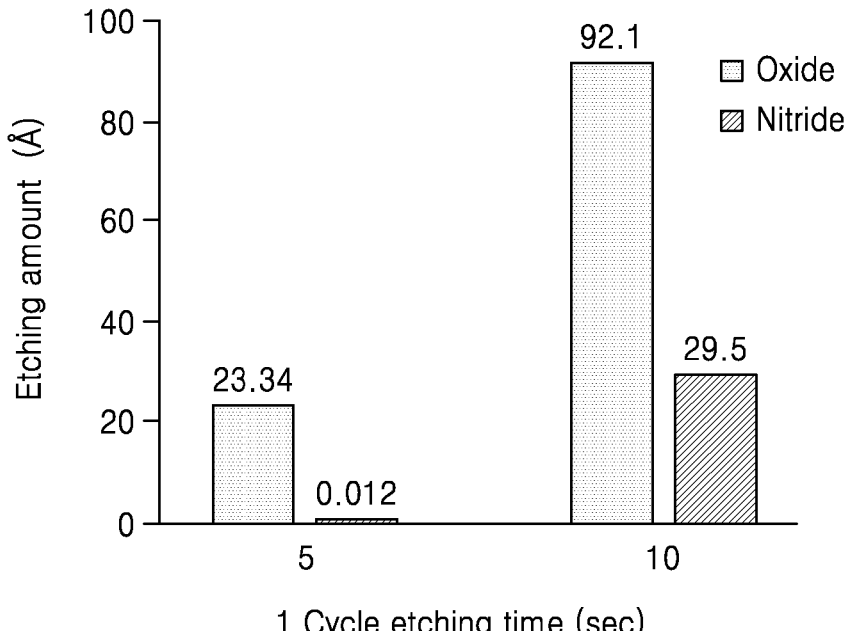
FIG. 10 is a graph showing an etching selectivity of an oxide film and a nitride film according to a process time of a substrate treatment step in the method of treating the substrate according to an experimental example of the present invention.

FIG. 10 is a graph showing an etching selectivity of an oxide film and a nitride film according to a process time of a substrate treatment step in the method of treating the substrate according to an experimental example of the present invention.

A left side of FIG. 10 corresponds to a case in which the method of treating the substrate according to the embodiment of the present invention is applied by using the apparatus 1000B for treating the substrate according to the second embodiment of the present invention, in which an etching selectivity of an oxide film and a nitride film according to a process time of the substrate treatment step is shown. In detail, when the unit cycle S20 is repeatedly performed by applying 5 seconds of the process time (from t3 to t4 in FIG. 2) of the substrate treatment step S22 described in FIG. 1, it may be found that an etching amount of the oxide film is 23.34 Å, and an etching amount of the nitride film is 0.012 Å.

In contrast, a right side of FIG. 10 shows an etching selectivity of an oxide film and a nitride film according to a process time of a substrate treatment step in a method of treating a substrate according to a comparative example of the present invention. In detail, when the unit cycle S20 is repeatedly performed by applying 10 seconds of the process time (from t3 to t4 in FIG. 2) of the substrate treatment step S22 described in FIG. 1, it may be found that an etching amount of the oxide film is 92.1 Å, and an etching amount of the nitride film is 29.5 Å.

In other words, it may be found that while the etch selectivity of the oxide film and the nitride film is about 3.1 in the method of treating the substrate according to the comparative example of the present invention, the etch selectivity of the oxide film and the nitride film is about 1945 in the method of treating the substrate according to the embodiment of the present invention, which is remarkably improved.

According to the method of treating the substrate of the embodiment of the present invention, the substrate treatment step S22 in the unit cycle S20 may be performed only during the process period (period from t3 to t4 in FIG. 2) in which the reaction gas reacts with the first thin film before substantially reacting with the second thin film. In this case, since the reaction gas reacts only with the first thin film without reacting with the second thin film, it may be found that the process selectivity between the first thin film and the second thin film is increased.

In other words, according to the method of treating the substrate of the embodiment of the present invention, it may be understood that the substrate treatment process may be performed by using the difference between the times at which the reaction gas reacts with the first thin film and the second thin film, and the operation of stopping the process of generating the reaction gas before the second thin film reacts with the reaction gas may be repeatedly performed to selectively treat one of the first thin film and the second thin film by a specific thickness.

The method of treating the substrate and the apparatus for treating the substrate according to one embodiment of the present invention described above may be applied to a substrate etching method and a substrate etching apparatus, respectively.

Although the embodiment of the present invention has been described with reference to the drawings, the embodiment has been set forth only for illustrative purposes, and it will be understood by those having ordinary skilled in the art that various modifications and other equivalent embodiments can be made from the present invention. Therefore, the technical scope of the present invention is to be defined by the technical idea of the appended claims.

What is claimed is:

1. An apparatus for treating a substrate, the apparatus comprising:
    a plasma chamber for providing a plasma generation space;
    a first treatment gas supply unit connected to the plasma generation space of the plasma chamber and configured to supply a first treatment gas to the plasma generation space of the plasma chamber;
    a plasma power source for applying a power to excite the first treatment gas supplied to the plasma chamber into a plasma state;
    a process chamber provided under the plasma chamber and having an inner space;
    a second treatment gas supply unit connected to the inner space of the process chamber and configured to supply a second treatment gas to the inner space of the process chamber; a support unit for supporting the substrate in the inner space;
    an ion blocker provided between the plasma chamber and the process chamber, and through which radicals constituting plasma of the first treatment gas selectively pass downward; and
    a controller configured to output control signals to the plasma power source, the first treatment gas supply unit, and the second treatment gas supply unit to control a timing and flow rate of the first treatment gas and the second treatment gas and control power application of the plasma power source,
    wherein the controller is configured further to repeat a unit cycle a predetermined number of times,
    wherein the controller is configured further to:
    perform, during a process period of each unit cycle, a substrate treatment step of exposing the substrate to a reaction gas which is a mixture of radicals of the first treatment gas and the second treatment gas in the inner space, and
    terminate the process period by stopping supply of the first treatment gas and the second treatment gas,
    wherein the controller is configured further to:
    expose, in each unit cycle, the substrate to the second treatment gas without exposing the substrate to the radicals before the substrate treatment step, and prevent, in each unit cycle, the substrate from being exposed to the radicals and the second treatment gas after the substrate treatment step.

18

2. The apparatus of claim 1,
    wherein the substrate includes a first thin film, and a second thin film having a lower reactivity to the reaction gas than the first thin film.

3. The apparatus of claim 1,
    wherein the controller is configured further to output a control signal for controlling a pumping unit connected to the process chamber, so that a pressure inside the process chamber in the preventing of the substrate from being exposed to the radicals and the second treatment gas after the substrate treatment step is lower than a pressure inside the process chamber in the substrate treatment step.

4. The apparatus of claim 1,
    wherein the first treatment gas includes NF3, H2, or NH3, and
    the second treatment gas includes NH3 or H2.

5. The apparatus of claim 2,
    wherein the first thin film includes a silicon oxide film, and
    the second thin film includes a silicon nitride film.

6. The apparatus of claim 1, further comprising
    a showerhead configured to partition the inner space of the process chamber into a reaction gas generation space for generating the reaction gas in which the radicals are mixed with the second treatment gas, and a treatment space for treating the substrate, and having a plurality of distribution holes through which the reaction gas flows from the reaction gas generation space to the treatment space.

7. The apparatus of claim 1,
    wherein the process chamber and the plasma chamber contact each other so as to be formed integrally with each other with the ion blocker interposed between the process chamber and the plasma chamber.

8. The apparatus of claim 1,
    wherein the plasma chamber includes a remote plasma chamber spaced apart from the process chamber.

9. The apparatus of claim 1,
    wherein the ion blocker has a plurality of through-openings through which the radicals generated in the plasma generation space flow into the inner space.

10. The apparatus of claim 1,
    wherein the ion blocker is grounded to absorb ions and electrons constituting the plasma of the first treatment gas.

11. An apparatus for treating a substrate, the apparatus comprising:
    a plasma chamber for providing a plasma generation space;
    a first treatment gas supply unit connected to the plasma generation space of the plasma chamber and configured to supply a first treatment gas including fluorine to the plasma generation space of the plasma chamber;
    a plasma power source for applying a power to excite the first treatment gas supplied to the plasma chamber into a plasma state;
    a process chamber provided under the plasma chamber, and having an inner space;
    a second treatment gas supply unit connected to the inner space of the process chamber and configured to supply a second treatment gas including ammonia to the inner space of the process chamber;
    a support unit for supporting the substrate on which a silicon oxide film and a silicon nitride film are formed in the inner space;

an ion blocker provided between the plasma chamber and the process chamber, configured to absorb ions and electrons constituting plasma of the first treatment gas, and through which fluorine radicals constituting the plasma of the first treatment gas selectively pass downward;

a showerhead configured to partition the inner space into a reaction gas generation space for generating a reaction gas in which the fluorine radicals are mixed with the second treatment gas including the ammonia, and a treatment space for treating the substrate by using the reaction gas, and having a plurality of distribution holes through which the reaction gas flows from the reaction gas generation space to the treatment space; and a controller configured to output control signals to the plasma power source, the first treatment gas supply unit, and the second treatment gas supply unit to control a timing and flow rate of the first treatment gas and the second treatment gas and control power application of the plasma power source, wherein the controller is configured further to repeat a unit cycle a predetermined number of times, wherein the controller is configured further to:

(i) perform, during a process period of each unit cycle, a substrate treatment process of exposing the substrate to the reaction gas, and (ii) terminate the process period by stopping supply of the first treatment gas and the second treatment gas, iii) expose, in each unit cycle, the substrate to the second treatment gas without exposing the substrate to the radicals before the performing of the substrate treatment process, and iv) prevent, in each unit cycle, the substrate from being exposed to the radicals and the second treatment gas after the performing of the substrate treatment process.

\* \* \* \* \*